(12) United States Patent
Uto et al.

(10) Patent No.: US 10,505,065 B2
(45) Date of Patent: Dec. 10, 2019

(54) METHOD FOR MANUFACTURING PHOTOELECTRIC CONVERSION DEVICE

(71) Applicant: Kaneka Corporation, Osaka (JP)

(72) Inventors: Toshihiko Uto, Osaka (JP); Daisuke Adachi, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/016,315

(22) Filed: Jun. 22, 2018

(65) Prior Publication Data

US 2018/0301581 A1 Oct. 18, 2018

Related U.S. Application Data

(63) Continuation of application No. PCT/JP2016/086245, filed on Dec. 6, 2016.

(30) Foreign Application Priority Data

Dec. 24, 2015 (JP) .................................. 2015-252698

(51) Int. Cl.
*H01L 37/00* (2006.01)
*H01L 31/0747* (2012.01)
*H01L 31/18* (2006.01)

(52) U.S. Cl.
CPC ...... *H01L 31/0747* (2013.01); *H01L 31/1804* (2013.01); *H01L 31/186* (2013.01); *H01L 31/1876* (2013.01); *Y02E 10/50* (2013.01); *Y02P 70/521* (2015.11)

(58) Field of Classification Search
None
See application file for complete search history.

(56) References Cited

U.S. PATENT DOCUMENTS

| 10,256,362 B2 * | 4/2019 | Augusto ............... H01L 31/042 |
| 2004/0182433 A1 * | 9/2004 | Terakawa .......... H01L 31/03762 136/255 |

(Continued)

FOREIGN PATENT DOCUMENTS

| JP | 2841335 B2 | 12/1998 |
| JP | 2014-049675 A | 3/2014 |

(Continued)

OTHER PUBLICATIONS

International Search Report issued in International Application No. PCT/JP2016/086245, dated Feb. 14, 2017 (2 pages).

(Continued)

*Primary Examiner* — Evren Seven
(74) *Attorney, Agent, or Firm* — Osha Liang LLP

(57) ABSTRACT

In manufacturing a crystalline silicon-based solar cell, a first intrinsic thin-film is formed on a conductive single-crystalline silicon substrate, and then a hydrogen plasma etching is performed. A second intrinsic thin-film is formed on the first intrinsic thin-film after the hydrogen plasma etching, and a conductive silicon-based thin-film is formed on the second intrinsic thin-film. The second intrinsic thin-film is formed by plasma-enhanced CVD with a silicon-containing gas and hydrogen being introduced into a CVD chamber. The amount of the hydrogen introduced into the CVD chamber during formation of the second intrinsic thin-film is 50 to 500 times an introduction amount of the silicon-containing gas.

13 Claims, 3 Drawing Sheets

(56) References Cited

U.S. PATENT DOCUMENTS

| | | | |
|---|---|---|---|
| 2009/0142878 A1* | 6/2009 | Choi | H01L 21/02532 438/96 |
| 2012/0318335 A1* | 12/2012 | Abou-Kandil | H01L 31/075 136/255 |
| 2012/0319111 A1* | 12/2012 | Kadota | H01L 31/03682 257/53 |
| 2013/0210185 A1* | 8/2013 | Yoshimi | H01L 31/1804 438/57 |
| 2013/0221373 A1* | 8/2013 | Chen | H01L 31/075 257/77 |
| 2016/0190375 A1* | 6/2016 | Chen | H01L 31/0747 136/255 |
| 2016/0240708 A1* | 8/2016 | Chen | H01L 31/1884 |
| 2016/0247960 A1* | 8/2016 | Bettinelli | H01L 31/022475 |

FOREIGN PATENT DOCUMENTS

| | | |
|---|---|---|
| JP | 2014-072406 A | 4/2014 |
| WO | 2012/043124 A1 | 4/2012 |
| WO | 2012/085155 A2 | 6/2012 |
| WO | 2013/161668 A1 | 10/2013 |

OTHER PUBLICATIONS

International Preliminary Report on Patentability issued in International Application No. PCT/JP2016/086245; dated Jul. 5, 2018 (13 pages).

\* cited by examiner ents of the present invention relate to a method for manufacturing a crystalline silicon-based photoelectric conversion device having a heterojunction on a surface of a single-crystalline silicon substrate.

METHOD FOR MANUFACTURING PHOTOELECTRIC CONVERSION DEVICE

TECHNICAL FIELD

One or more embodiments of the present invention relate to a method for manufacturing a crystalline silicon-based photoelectric conversion device having a heterojunction on a surface of a single-crystalline silicon substrate.

BACKGROUND

As a solar cell with high conversion efficiency a heterojunction solar cell having an amorphous silicon thin-film on a surface of a single-crystalline silicon substrate is known. In a heterojunction solar cell, an intrinsic silicon-based thin-film is inserted between a single-crystalline silicon substrate and a conductive silicon-based thin-film to attain a passivation effect such as termination of defects (mainly dangling bonds of silicon) present on a surface of the crystalline silicon substrate with hydrogen. Thus, carrier recombination on the surface of the crystalline silicon substrate is suppressed, so that photoelectric conversion efficiency can be improved.

A method has been proposed in which a surface of a crystalline silicon substrate or an intrinsic silicon-based thin-film formed thereon is exposed to hydrogen plasma (hydrogen plasma treatment) for the purpose of further improving the conversion efficiency of a heterojunction solar cell. For example, Patent Document 1 suggests that before an amorphous silicon-based thin-film is formed on a crystalline silicon substrate, a surface of the crystalline silicon substrate is subjected to a hydrogen plasma treatment to clean the substrate surface.

Patent Document 2 suggests a method in which an intrinsic amorphous silicon thin-film having a thickness of 1 to 10 nm is formed on a crystalline silicon substrate, and then a hydrogen plasma treatment is followed by formation of a remain thickness portion of the intrinsic amorphous silicon thin-film. When an intrinsic amorphous silicon thin-film is formed in a part of the total thickness, and a hydrogen plasma treatment is then performed as described above, a surface of a crystalline silicon substrate is exposed to hydrogen plasma through the silicon thin-film, and therefore defects on the substrate surface can be cleaned off while plasma damage to the surface of the crystalline silicon substrate is suppressed.

However, when the intrinsic amorphous silicon thin-film is subjected to a hydrogen plasma treatment, the surface of the amorphous silicon film may be etched and damaged depending on the condition of the plasma treatment. Patent Document 3 and Patent Document 4 suggests that a hydrogen plasma treatment is performed not only after formation of an intrinsic amorphous silicon thin-film in a part of the total thickness, but also after the entire thickness of the intrinsic amorphous silicon thin-film is formed and before formation of a conductive silicon thin-film.

Patent Document 3 suggests that when a hydrogen plasma treatment is performed after formation of the entire thickness of the intrinsic amorphous silicon thin-film, the interface subjected to the hydrogen plasma treatment is restored, so that the film quality of the whole intrinsic amorphous silicon thin-film is improved, and therefore further improvement of conversion efficiency can be expected. Patent Document 4 suggests that not only a passivation effect is attained by a hydrogen plasma treatment, but also the passivation effect is improved by performing chemical vapor deposition (CVD) while introducing hydrogen in an amount of 2 to 6 times the amount of a source gas such as silane during formation of the intrinsic amorphous silicon thin-film.

PRIOR ART DOCUMENTS

Patent Documents

Patent Document 1: Japanese Patent No. 2841335
Patent Document 2: International Publication No. WO 2012/043124
Patent Document 3: Japanese Patent Laid-open Publication No. 2014-72406
Patent Document 4: International Publication No. WO 2012/085155

In manufacturing of a heterojunction solar cell, a silicon-based thin-film is deposited on a single-crystalline silicon substrate by plasma-enhanced CVD. In mass production of crystalline silicon-based solar cells, commonly a plurality of silicon substrates are mounted on a deposition tray, and a silicon-based thin-film is deposited by plasma-enhanced CVD. A hydrogen plasma treatment during or after deposition of a silicon-based thin-film can be performed with a deposition tray set in a CVD chamber for deposition of a silicon-based thin-film.

As disclosed in Patent Documents 2 to 4, improvement of the conversion efficiency of a heterojunction solar cell by reduction of defects at the interface or improvement of film quality can be expected when a hydrogen plasma treatment is performed after deposition of an intrinsic silicon-based thin-film on a single-crystalline silicon substrate. However, as a result of studies by the present inventors, it has been found that when a hydrogen plasma treatment is performed on a plurality of silicon substrates mounted on a deposition tray, a difference in position of the silicon substrate in a CVD chamber may cause a variation in conversion characteristics, particularly in open circuit voltage (Voc). In particular, when deposition is continuously performed in a plurality of batches while deposition trays are replaced without carrying out maintenance of the inside of a CVD chamber, the conversion characteristics of cells obtained by performing deposition and a hydrogen plasma treatment on substrates disposed at the central portion of the tray and in the vicinity thereof are markedly deteriorated with an increase in the number of continuous deposition batches.

When a plurality of cells are connected in series to modularize solar cells, the current of a cell showing the smallest current value is a bottleneck of the current of the module. When a plurality of cells are connected in parallel to modularize solar cells, the voltage of a cell showing the smallest voltage value is a bottleneck of the voltage of the module. That is, in a solar cell module in which a plurality of cells are connected in series and/or in parallel, module efficiency depends on a cell having the poorest characteristics. Thus, when there is a large cell characteristic variation within one batch or among batches during preparation of cells, module efficiency is considerably deteriorated. On the other hand, when the frequency of maintenance of the inside of a CVD chamber by decreasing the number of continuous deposition batches for reducing a cell characteristic variation within one batch and among batches, the operation rate of an apparatus is reduced, so that production efficiency is considerably deteriorated.

SUMMARY

One or more embodiments of the present invention provide a method for manufacturing a heterojunction solar cell suitable for mass production, wherein conversion characteristics can be improved by a hydrogen plasma treatment of an intrinsic silicon-based thin-film, and a cell characteristic variation within one batch and among batches can be suppressed even when the number of continuous deposition batches is increased.

One or more embodiments of the present invention relate to a method for manufacturing a crystalline silicon-based solar cell including an intrinsic silicon-based thin-film and a conductive silicon-based thin-film in this order on one principal surface of a conductive single-crystalline silicon substrate. By etching the intrinsic silicon-based thin-film with hydrogen plasma, and then depositing the intrinsic silicon-based thin-film by CVD at a high hydrogen dilution ratio, a cell characteristic variation can be suppressed even when the number of continuous deposition batches is increased.

A method for manufacturing a crystalline silicon-based solar cell according to one or more embodiments of the present invention includes the steps of forming a first intrinsic thin-film having a thickness of 3 to 15 nm on a conductive single-crystalline silicon substrate; exposing a surface of the first intrinsic thin-film to hydrogen plasma to perform hydrogen plasma etching; forming a second intrinsic thin-film having a thickness of 0.5 to 5 nm on the first intrinsic thin-film after hydrogen plasma etching; and forming a conductive silicon-based thin-film on the second intrinsic thin-film so as to be in contact with the second intrinsic thin-film, in this order.

In one or more embodiments, the first intrinsic thin-film is formed by plasma-enhanced CVD with a silicon-containing gas being introduced into a CVD chamber. For forming the first intrinsic thin-film, hydrogen may be introduced into the CVD chamber in addition to the silicon-containing gas. The second intrinsic thin-film may be formed by plasma-enhanced CVD with a silicon-containing gas and hydrogen being introduced into a CVD chamber.

In one or more embodiments, the amount of hydrogen introduced into the CVD chamber during formation of the second intrinsic thin-film may be 50 to 500 times the introduction amount of the silicon-containing gas. The power density during formation of the second intrinsic thin-film may be 0.7 to 1.3 times the power density during the hydrogen plasma etching. The power density during hydrogen plasma etching may be not less than twice the power density during formation of the first intrinsic thin-film. The power density during formation of the second intrinsic thin-film may be not less than twice the power density during formation of the first intrinsic thin-film.

In some embodiments, the amount of hydrogen introduced into the CVD chamber during formation of the first intrinsic thin-film may be less than 50 times the introduction amount of the silicon-containing gas. The deposition rate of the first intrinsic thin-film may be 0.1 nm/sec or more in terms of a value calculated as a deposition rate on a smooth surface.

The difference $d_0-d_1$ between the thickness $d_0$ of the first intrinsic thin-film before hydrogen plasma etching and the thickness $d_1$ of the first intrinsic thin-film after hydrogen plasma etching may be 0.5 to 5 nm in some embodiments. The thickness $d_2$ of the second intrinsic thin-film may be 0.5 to 2 times the difference $d_0-d_1$.

In one or more embodiments, formation of the first intrinsic thin-film may be divided into a plurality of times of sublayer deposition. When the formation of the first intrinsic thin-film is accomplished by the deposition of n sublayers, including first to $n^{th}$ sublayers in this order from the conductive single-crystalline silicon substrate side, the hydrogen plasma etching is performed after deposition of the $n^{th}$ sublayer. In addition, an intermediate hydrogen plasma treatment may be performed in which the surface of each of the first to $(n-1)^{th}$ sublayers is exposed to hydrogen plasma after deposition of each of the sublayers. In one or more embodiments, each of the sublayers is deposited to have a thickness of 1 to 8 nm. In particular, it may be possible that the first sublayer which is in contact with the silicon substrate is deposited to have a thickness of 1 to 6 nm.

In one or more embodiments, n is an integer of 2 or more. For example, when n is 2, the first intrinsic thin-film is formed by depositing the first sublayer and the second sublayer. In this case, it may be possible that the surface of the first sublayer is subjected to a hydrogen plasma treatment after deposition of the first sublayer, and the hydrogen plasma etching is performed after deposition of the second sublayer.

In the manufacturing method of one or more embodiments of the present invention, it may be possible that the hydrogen plasma etching treatment and deposition of the second intrinsic thin-film are performed in the same CVD chamber. Further, formation of the first intrinsic thin-film and/or formation of the conductive silicon-based thin-film may be performed in the same CVD chamber as that for the hydrogen plasma etching treatment and formation of the second intrinsic thin-film.

According to the method of one or more embodiments of the present invention, a crystalline silicon-based solar cell with high conversion efficiency can be obtained. In addition, even when the number of continuous deposition batches of silicon-based thin-films is increased, the cell characteristic variation within one batch and among batches is small, so that the quality of the cell can be stabilized. Thus, the frequency of maintenance of the inside of a CVD chamber can be reduced to improve the production efficiency of the solar cell. Further, since the cell characteristic variation is small, module characteristics can be improved when a solar cell module is prepared by electrically connecting a plurality of cells.

DETAILED DESCRIPTION OF THE EMBODIMENTS

Figure 1:
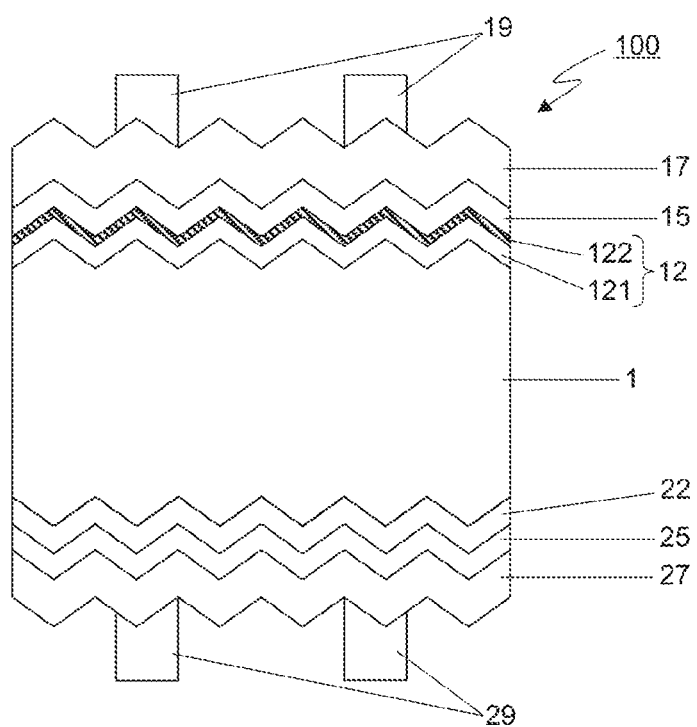
FIG. 1 is a schematic sectional view showing one embodiment of a crystalline silicon-based solar cell.

FIG. 1 is a schematic sectional view showing one embodiment of a crystalline silicon-based solar cell. A solar cell 100 in FIG. 1 includes intrinsic silicon-based thin-films 12 and 22 and conductive silicon-based thin-films 15 and 25 in this order on a first principal surface (p-layer side) and a second principal surface (n-layer side), respectively, of the silicon substrate 1. The conductive silicon-based thin-film 15 on the first principal surface and the conductive silicon-based thin-film 25 on the second principal surface have different conductivity-types. In other words, the conductive silicon-based thin-film 15 on the first principal surface is p-type, and the conductive silicon-based thin-film 25 on the second principal surface is n-type. Transparent electroconductive layers 17 and 27 and metal electrodes 19 and 29 are formed on the conductive silicon-based thin-films 15 and 25, respectively.

The silicon substrate 1 is an n-type or p-type conductive single-crystalline silicon substrate. In general, an electron has a higher mobility than a hole. Thus, when the silicon substrate 1 is an n-type single-crystalline silicon substrate, the conversion characteristics of the solar cell may be improved. A light-receiving surface of the solar cell 100 may be either on the p-layer side or on the n-layer side. In the heterojunction solar cell, when a heterojunction on the light-receiving side is a reverse junction, a strong electric field is formed, so that photoproduction carriers (electrons and holes) can be efficiently separated and recovered. Thus, when the silicon substrate has n-type conductivity, it may be possible that the light-receiving surface is on the p-layer side. When a patterned metal electrode is provided on each of both transparent electroconductive layers as shown in FIG. 1, both the surfaces on the p-layer side and the n-layer side may be a light-receiving surface.

From a viewpoint of light confinement, a texture (uneven structure) may be formed on a surface of the silicon substrate 1. The single-crystalline silicon substrate may have plane orientation of (100) plane in order to form a texture on its surface. This is because when the single-crystalline silicon substrate is etched, a textured surface structure is easily formed by anisotropic etching that exploits the difference in etching rate between the (100) plane and the (111) plane.

The intrinsic silicon-based thin-films 12 and 22 and the conductive silicon-based thin-films 15 and 25 are thin-films composed of a silicon-based material. Since the intrinsic silicon-based thin-films 12 and 22 are disposed between the single-crystalline silicon substrate 1 and the conductive silicon-based thin-films 15 and 25, respectively a surface of the silicon substrate is effectively passivated. For improving the passivation effect on the surface of the silicon substrate, the intrinsic silicon-based thin-films 12 and 22 may be non-doped hydrogenated silicon substantially composed of silicon and hydrogen. Examples of the silicon-based material include silicon alloys such as silicon carbide, silicon nitride and silicon germanium in addition to silicon.

Although the method for forming a silicon-based thin-film is not limited, in one or more embodiments a plasma-enhanced CVD may be possible. When a silicon-based thin-film is deposited by plasma-enhanced CVD, deposition of a silicon-based thin-film and a hydrogen plasma treatment can be performed in the same chamber, so that the process can be simplified.

In one or more embodiments, a source gas used for deposition of the silicon-based thin-films by plasma-enhanced CVD may be a silicon-containing gas such as $SiH_4$ or $Si_2H_6$. A source gas diluted with, for example, a hydrogen gas ($H_2$) may be introduced to a chamber. A dopant gas for forming the conductive (p-type or n-type) silicon-based layer may be, for example, $B_2H_6$ or $PH_3$. In one or more embodiments, the amount of impurity such as P or B added is sufficient to be a trace amount; thus, a mixed gas wherein a dopant gas is beforehand diluted with the source gas, $H_2$ or the like may be used. In one or more embodiments, a gas containing a different element, such as $CH_4$, $CO_2$, $NH_3$ or $GeH_4$, may be added to the aforementioned gas to form a silicon alloy thin-film, such as silicon carbide, silicon nitride and silicon germanium, as the silicon-based layer. Deposition conditions for forming the silicon-based thin-films by a plasma-enhanced CVD method may be as follows: a substrate temperature of 100 to 300° C.; a pressure of 20 to 2600 Pa; and a high-frequency power density of 3 to 500 $mW/cm^2$.

[Deposition of Silicon-Based Thin-Film on Silicon Substrate]

In the manufacturing method of one or more embodiments of the present invention, deposition is temporarily stopped midway, and plasma etching is performed under a hydrogen atmosphere in at least any one of formation of the intrinsic silicon-based thin-film 12 on the first principal surface of the silicon substrate 1 and formation of the intrinsic silicon-based thin-film 22 on the second principal surface of the silicon substrate 1. Hereinafter, formation of the intrinsic silicon-based thin-film 12 and the p-type silicon-based thin-film 15 on the first principal surface of the silicon substrate 1 will be described with reference to FIGS. 2(A), 2(B), 2(C), and 2(D).

FIGS. 2(A), 2(B), 2(C), and 2(D) are a conceptual view for illustrating a process for forming a silicon-based thin-film on a silicon substrate. First, a first intrinsic thin-film 121 is deposited on the principal surface of the silicon substrate 1 (FIG. 2(A)). Thereafter, the surface of the first intrinsic thin-film 121 is subjected to hydrogen plasma etching by exposing the surface to hydrogen plasma (FIG. 2 (B)). A second intrinsic thin-film 122 is deposited on the first intrinsic thin-film 121 after hydrogen plasma etching (FIG. 2 (C)). Thus, in one or more embodiments of the present invention, hydrogen plasma etching is performed during formation of the intrinsic silicon-based thin-film 12 on the silicon substrate 1. The p-type silicon-based thin-film 15 is deposited on the intrinsic silicon-based thin-film 12 (FIG. 2(D)). The p-type silicon-based thin-film 15 is deposited so as to be in contact with the second intrinsic thin-film 122.

<Intrinsic Silicon-Based Thin-Film>

In some embodiments, the intrinsic silicon-based thin-film 12 is deposited by plasma-enhanced CVD. In deposition of the intrinsic silicon-based thin-film by plasma-enhanced CVD, the silicon substrate is introduced into a chamber of a plasma-enhanced CVD apparatus at the set out. A plurality of silicon substrates may be mounted on a mounting member such as a deposition tray and introduced into the chamber. In addition, the silicon substrate may be fixed at a predetermined position in the chamber by a suction method or the like. By introducing a plurality of silicon substrates into the chamber and performing deposition on a plurality of silicon substrates in one batch, the production efficiency of the solar cell can be improved.

(Deposition of First Intrinsic Thin-Film)

Figure 2A:
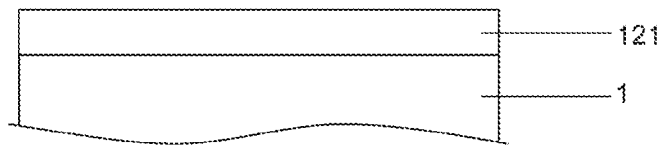
FIGS. 2(A), 2(B), 2(C) and 2(D) are conceptual views for illustrating a process for forming a silicon-based thin-film on a silicon substrate.

In one or more embodiments, after introduction of the silicon substrate into the chamber, the substrate is heated as necessary. Thereafter, a silicon-containing gas and a diluting gas such as hydrogen as necessary are introduced into the chamber, and the first intrinsic thin-film 121 is deposited on the silicon substrate 1 as shown in FIG. 2(A).

The first intrinsic thin-film 121 is a layer adjacent to the silicon substrate 1, and acts as a passivation layer on a surface of the silicon substrate. For effectively passivating the surface, the first intrinsic thin-film 121 may be amorphous at an initially deposited portion in the vicinity of the interface with the silicon substrate 1. Thus, it may be possible that the first intrinsic thin-film is deposited at a high rate. The deposition rate of the first intrinsic thin-film may be 0.1 nm/second or more, 0.15 nm/second or more, or 0.2 nm/second or more. By increasing the deposition rate, epitaxial growth of silicon is suppressed, so that an amorphous film is easily formed.

Since a substrate with a texture formed on a surface thereof has a larger surface area as compared to a smooth substrate having no texture, the deposition rate on a substrate provided with a texture is lower than the deposition rate on a smooth surface. The deposition rate is determined as a value calculated in terms of a deposition rate on a smooth surface. On a silicon substrate without a texture, a glass plate or the like, a film is deposited for a predetermined period of time under the same condition, the thickness of the film is measured by spectroscopic ellipsometry, and the deposition rate on the smooth surface can be calculated from the measured thickness. The thickness of a thin-film on a silicon substrate provided with a texture is a thickness in a direction perpendicular to the slope of the texture and can be determined by observing a cross-section with a transmission electron microscope (TEM).

The deposition rate tends to be increased in one or more embodiments by decreasing the introduction amount of hydrogen (dilution ratio with hydrogen) during deposition of the first intrinsic thin-film. The introduction amount of hydrogen during deposition of the first intrinsic thin-film may be less than 50 times the introduction amount of the silicon-containing gas. The introduction amount of hydrogen may be not more than 20 times, not more than 10 times, or not more than 6 times the introduction amount of the silicon-containing gas. The first intrinsic thin-film may be deposited without introducing hydrogen. By adjusting the process pressure, power density and the like during deposition, the deposition rate can be increased.

In one or more embodiments, the first intrinsic thin-film 121 is deposited to have a thickness of 3 nm to 15 nm. The deposition thickness $d_0$ of the first intrinsic thin-film is a thickness before hydrogen plasma etching is performed. The deposition thickness of the first intrinsic thin-film may be 3.5 nm to 12 nm, or 4 nm to 10 nm. When the deposition thickness of the first intrinsic thin-film is excessively small, the passivation effect on the single-crystalline silicon substrate tends to be insufficient, or a surface of the silicon substrate tends to be susceptible to plasma damage during plasma etching of the first intrinsic thin-film. The deposition thickness of the first intrinsic thin-film may be 10 nm or less, or 8 nm or less. When the thickness of the first intrinsic thin-film is excessively large, conversion characteristics tend to be deteriorated due to light absorption by the intrinsic silicon-based thin-film or electrical loss resulting from an increased resistance.

(Hydrogen Plasma Etching of Surface of First Intrinsic Thin-Film)

Figure 2B:
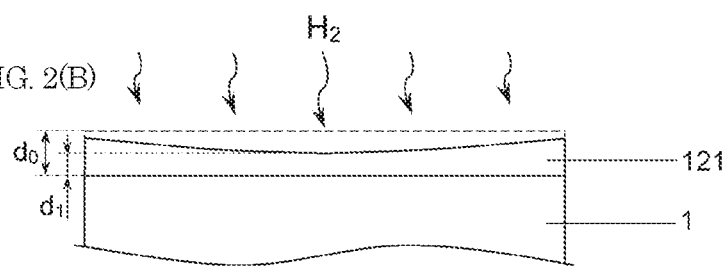

After deposition of the first intrinsic thin-film 121, the surface of the first intrinsic thin-film is subjected to hydrogen plasma etching by an exposure to hydrogen plasma as shown in FIG. 2(B). The conversion characteristics of the solar cell, especially the open circuit voltage (Voc) and fill factor (FF) tend to be improved when the surface of the first intrinsic thin-film after the deposition is etched by hydrogen plasma.

Improvement of the open circuit voltage in one or more embodiments may result from improvement of the film quality of the silicon-based thin-film due to exposure to hydrogen plasma (termination of dangling bonds by introduction of hydrogen into the film), and improvement of interface characteristics. Generally, when the thickness of the intrinsic silicon-based thin-film decreases, the passivation effect on the silicon substrate tends to be reduced, leading to a decrease in open circuit voltage of the solar cell. On the other hand, when the thickness of the first intrinsic thin-film is reduced by hydrogen plasma etching, the effect of improving film quality and improving interface characteristics may sufficiently compensate for reduction of the passivation effect due to a decrease in thickness, resulting in improvement of the open circuit voltage. In addition, improvement of the film quality of the first intrinsic thin-film and reduction of the thickness of hydrogen plasma etching may decrease series resistance by the intrinsic silicon-based thin-film, resulting in improvement of the fill factor.

In general, when the thickness of the intrinsic silicon-based thin-film on the silicon substrate is increased, the open circuit voltage tends to be improved, leading to reduction of the fill factor, and when the thickness of the intrinsic silicon-based thin-film is decreased, the fill factor tends to be improved, leading to reduction of the open circuit voltage. On the other hand, by performing hydrogen plasma etching after deposition of the first intrinsic thin-film, both the fill factor and the open circuit voltage can be improved, so that the conversion characteristics of the solar cell tend to be improved.

In one or more embodiments, hydrogen plasma etching is performed under a hydrogen-containing atmosphere. In one or more embodiments, hydrogen plasma etching is performed under an atmosphere with a hydrogen concentration of 50% by volume or more. The hydrogen concentration during hydrogen plasma etching may be 60% by volume or more, or 70% by volume or more. The atmospheric gas in hydrogen plasma etching may contain an inert gas such as nitrogen, helium, argon or the like, and contain a very small amount of a dopant gas such as a $B_2H_6$ or $PH_3$ gas. On the other hand, it may be possible that a source gas such as a $SiH_4$ gas is not introduced into the chamber in hydrogen plasma etching. It may be possible that in hydrogen plasma etching, the residual amount of the source gas, which has been used for deposition of the first intrinsic thin-film, in the chamber is small, and the silicon-based thin-film is not substantially deposited during plasma discharge. Thus, the concentration of the silicon-containing gas in the chamber during hydrogen plasma etching may be less than 1/500, 1/1000 or less, or 1/2000 or less of the hydrogen concentration.

Conditions for hydrogen plasma etching may be the substrate temperature of 100° C. to 300° C., and the pressure of 20 Pa to 2600 Pa in one or more embodiments. The plasma power density and the treatment time during hydrogen plasma etching may be set so that the thickness of the first intrinsic thin-film is decreased by plasma etching.

In one or more embodiments, the etching amount in hydrogen plasma etching of the first intrinsic thin-film, i.e., the difference $d_0-d_1$ between the thickness $d_0$ of the first intrinsic thin-film before hydrogen plasma etching and the thickness $d_1$ of the first intrinsic thin-film after hydrogen plasma etching, may be 0.5 nm or more. When the plasma etching amount is 0.5 nm or more, the effect of improving the fill factor by reduction of the thickness is easily exhibited. On the other hand, when the amount of plasma etching is excessively large, the thickness of the first intrinsic thin-film may be excessively small, leading to a decrease in open circuit voltage of the solar cell due to reduction of the passivation effect and plasma damage to a surface of the silicon substrate. Therefore, the plasma etching amount $d_0-d_1$ may be 5 nm or less 4 nm or less, or 3 nm or less. When there is a variation in the deposition thickness or plasma etching amount in the surface of the silicon substrate, the value $d_0-d_1$ at the central portion in the surface is defined as a plasma etching amount. When a plurality of silicon substrates are treated in one batch, the average of values $d_0-d_1$ at the central ports of the silicon substrates is defined as a plasma etching amount. The thickness $d_2$ of a second intrinsic thin-film as described later is defined in the same manner as described above.

To perform sufficient plasma etching, the power density during hydrogen plasma etching may be 40 mW/cm$^2$ or more, 60 mW/cm$^2$ or more, 80 mW/cm$^2$ or more, or 100 mW/cm$^2$ or more. When hydrogen plasma etching of the first intrinsic thin-film is performed at a power density higher than that during deposition of the first intrinsic thin-film, the open circuit voltage of the solar cell tends to be remarkably improved. The power density during hydrogen plasma etching may be not less than 2 times, not less than 3 times, not less than 4 times, or not less than 5 times the power density during deposition of the first intrinsic thin-film.

On the other hand, in some embodiments, when the power density during the plasma treatment is excessively high, it may be difficult to control the etching amount. In addition, when the power density is excessively high, the film quality of the intrinsic silicon-based thin-film may be deteriorated, or plasma damage to a surface of the single-crystalline silicon substrate may occur, leading to deterioration of the conversion characteristics of the solar cell. Thus, the power density during hydrogen plasma etching may be 500 mW/cm$^2$ or less, 400 mW/cm$^2$ or less, 300 mW/cm$^2$ or less, or 250 mW/cm$^2$ or less.

When the plasma treatment time is excessively short, there arises the same tendency as in the case where the power density is excessively small. On the other hand, when the plasma treatment time is excessively long, there arises the same tendency as in the case where the power density is excessively large. Thus, the treatment time of hydrogen plasma etching may be 3 to 140 seconds, 5 to 100 seconds, or 10 to 60 seconds.

As described above, the initially deposited portion of the first intrinsic thin-film 121 may be amorphous for improving the function as a passivation layer on a surface of the silicon substrate 1. On the other hand, a portion of the first intrinsic thin-film 121 in the vicinity of an interface on the second intrinsic thin-film 122 side may be exposed to hydrogen plasma to be crystallized. Crystallization of the surface of the first intrinsic thin-film 121 tends to promote crystallization of the second intrinsic thin-film 122 formed thereon.

(Deposition of Second Intrinsic Thin-Film)

Figure 2C:
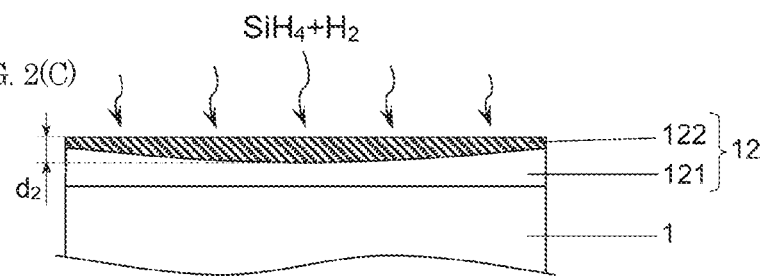

As shown in FIG. 2(C), the second intrinsic thin-film 122 is deposited on the first intrinsic thin-film 121 after hydrogen plasma etching. The second intrinsic thin-film 122 is deposited by plasma-enhanced CVD with a silicon-containing gas and hydrogen being introduced into a CVD chamber. The amount of hydrogen introduced into the chamber during deposition of the second intrinsic thin-film is set to 50 to 500 times the introduction amount of the silicon-containing gas. When the second intrinsic thin-film is deposited at a hydrogen dilution ratio higher than that during deposition of the first intrinsic thin-film, the second intrinsic thin-film 122 is a more orderly film, so that crystal grains are easily generated in the film. Thus, junction interface between the intrinsic silicon-based thin-film 12 and the conductive silicon-based thin-film tends to be improved, leading to further improvement of the open circuit voltage and fill factor of the solar cell as compared to a case where only hydrogen plasma etching is performed. The amount of hydrogen introduced into the chamber during deposition of the second intrinsic thin-film may be 80 to 450 times, or 100 to 400 times the introduction amount of the silicon-containing gas.

In one or more embodiments, the deposition thickness $d_2$ of the second intrinsic thin-film 122 may be 0.5 nm or more.

When the thickness $d_2$ is 0.5 nm or more, coverage with the second intrinsic thin-film is improved, and silicon crystal grains tend to be easily generated, leading to improvement of interface characteristics. On the other hand, when the thickness of the second intrinsic thin-film is excessively large, the fill factor of the solar cell tends to be reduced. Thus, the deposition thickness $d_2$ of the second intrinsic thin-film 122 may be 5 nm or less, 4 nm or less, or 3 nm or less. In addition, the deposition thickness $d_2$ of the second intrinsic thin-film 122 may be not more than 0.5 times, not more than 0.4 times, or not more than 0.3 times the thickness $d_1$ of the first intrinsic thin-film 121 after plasma etching.

For promoting crystal grain generation, the power density during deposition of the second intrinsic thin-film in one or more embodiments may be 40 mW/cm$^2$ or more, 60 mW/cm$^2$ or more, 80 mW/cm$^2$ or more, or 100 mW/cm$^2$ or more. In addition, when the second intrinsic thin-film is deposited at a power density higher than that during deposition of the first intrinsic thin-film, crystal grains tend to be easily generated. Thus, the power density during deposition of the second intrinsic thin-film may be not less than 2 times, not less than 3 times, not less than 4 times, or not less than 5 times the power density during deposition of the first intrinsic thin-film. The deposition rate of the second intrinsic thin-film may be 0.001 to 0.09 nm/second, 0.005 to 0.08 nm/second, or 0.01 to 0.07 nm/second as a value calculated in terms of a deposition rate on a smooth surface. In addition, the deposition rate of the second intrinsic thin-film may be not more than 0.5, or not more than 0.3 times the deposition rate of the first intrinsic thin-film.

When the second intrinsic thin-film 122 is deposited by plasma-enhanced CVD at a high hydrogen dilution ratio after hydrogen plasma etching of the first intrinsic thin-film 121, junction interface with the conductive silicon-based thin-film is improved, and the thickness distribution of the intrinsic silicon-based thin-film is reduced. Thus, a variation in quality of the cell tends to be reduced.

As a result of studies by the present inventors, it has been found that when hydrogen plasma etching is performed after deposition of the intrinsic silicon-based thin-film, the conversion characteristics of the solar cell tend to vary depending on a position (deposition position) of the silicon substrate in a chamber, leading to occurrence of a cell characteristic variation within one batch. It has been found that, in particular, when deposition is continuously performed in a plurality of batches while silicon substrates are replaced without carrying out maintenance of the inside of a CVD chamber, a variation in conversion characteristics tends to increase with an increase in the number of continuous deposition batches. As a result of further conducting studies, it has been found that the thickness of the intrinsic silicon-based thin-film after hydrogen plasma etching tends to be smaller on a substrate disposed in the vicinity of the center of the deposition surface in a chamber (substrate mounted in the vicinity of the center of a deposition tray) than on a substrate disposed at the end portion of the deposition surface (substrate mounted at the end portion of the deposition tray). In addition, it has been found that an increase in the number of continuous deposition batches tends to expand the thickness difference in a batch, which accordingly increases a variation in conversion characteristics of the solar cell.

On the other hand, when the second intrinsic thin-film of one or more embodiments is deposited by plasma-enhanced CVD at a high hydrogen dilution ratio after hydrogen plasma etching of the first intrinsic thin-film, a variation in thickness of the intrinsic silicon-based thin-film within one batch and among batches is reduced even when the number of continuous deposition batches increases. Thus, a variation in conversion characteristics of the solar cell tends to be reduced.

In one or more embodiments, the thickness of the intrinsic silicon-based thin-film after hydrogen plasma etching is relatively small in the vicinity of the center in the chamber. This phenomenon may be associated with the relatively large amount of plasma etching in the vicinity of the center in the chamber. This state is schematically shown in FIG. 2(B). The broken line in FIG. 2(B) shows the first intrinsic thin-film 121 before hydrogen plasma etching.

Figure 2D:
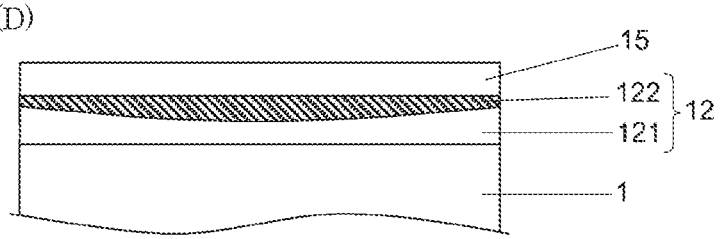

The phenomenon in which the plasma etching amount in the vicinity of the center is relatively large may be ascribable to the influence of a plasma intensity distribution in the deposition surface. In FIG. 2(B), the length of the arrow corresponds to the plasma intensity and a state is schematically shown in which the etching amount at the central portion is large because the plasma intensity at the central portion is larger than that at the end portion. For the sake of convenience, FIGS. 2(B), 2(C) and 2(D) schematically illustrate a distribution on one silicon substrate for simplifying illustrations of the in-plane distributions of the plasma intensity and the thickness. The same applies to FIGS. 3(A2), 3(A3), 3(B), 3(C) and 3(D) described later.

As a result of conducting studies by the present inventors, it has been found that an increase in the number of continuous deposition batches tends to expand the thickness difference in a batch, which accordingly increases a variation in conversion characteristics of the solar cells. In a deposition batch immediately after maintenance, such as cleaning, of the inside of a chamber is carried out, the variation in thickness changes due to the hydrogen plasma treatment within one batch is small because the distribution of the plasma intensity in the deposition surface is small. It is supposed that an in-plane distribution of the plasma intensity occurs such that the plasma intensity in the vicinity of the central portion is larger than that in the vicinity of the end portion as schematically shown in FIG. 2(B) due to, for example, an increase in stacking amount of a film accumulated on a chamber inner wall etc. with an increase in the number of continuous deposition batches.

It has been found, in some embodiments, that the plasma intensity distribution and the thickness distribution are small within the range of the size of one silicon substrate (e.g., about 6 inches) to be used for the solar cell, but when a plurality of silicon substrates are treated in one batch, the thickness distribution between the substrates tends to be conspicuous. It has been found that the thickness distribution between the substrates in a batch tends to increase as the number of substrates treated one time is increased with a large CVD chamber having a large deposition area. This tendency is remarkable when the deposition area is 0.3 m² or more, and this tendency is particularly remarkable when the deposition area is 0.5 m² or more.

In one or more embodiments of the present invention, even when the first intrinsic thin-films after hydrogen plasma etching have thickness distribution, the distribution can be reduced by depositing the second intrinsic thin-films on the first intrinsic thin-films at a high hydrogen dilution ratio. Thus, it is possible to reduce a variation in thicknesses of the intrinsic silicon-based thin-films within one batch or among batches. This may be because the stacking thickness of the second intrinsic thin-film has the same in-plane distribution as that of the plasma etching amount. To be more specific, it is considered that at a site where the plasma intensity is relatively high, both the plasma etching amount (etching rate) and the stacking amount (deposition rate) of the second intrinsic thin-film are relatively large, and at a site where the plasma intensity is relatively low, both the etching rate and the deposition rate are relatively small. In this way, the second intrinsic thin-film is formed so as to compensate for a decrease in thickness due to hydrogen plasma etching, and therefore it is considered that the variation in thicknesses of the intrinsic silicon-based thin-films is small, so that a variation in conversion characteristics of the solar cells can be reduced even when an in-plane distribution of the plasma intensity occurs.

The in-plane distribution of the plasma intensity tends to become more conspicuous as the power density of plasma increases. Thus, for forming the second intrinsic thin-film so as to compensate for the in-plane distribution of the plasma etching amount, the power density during deposition of the second intrinsic thin-film may be equivalent to the power density during hydrogen plasma etching. Specifically, the power density during deposition of the second intrinsic thin-film may be 0.7 to 1.3 times, or 0.8 to 1.2 times the power density during hydrogen plasma etching.

For forming the second intrinsic thin-film so as to compensate for the in-plane distribution of the plasma etching amount, the thickness $d_2$ of the second intrinsic thin-film may be equivalent to the plasma etching amount $d_0-d_1$. Thus, the thickness $d_2$ of the second intrinsic thin-film may be 0.5 to 2 times, 0.6 to 1.5 times, or 0.7 to 1.3 times the plasma etching amount $d_0-d_1$.

The sum of the thickness of the intrinsic silicon-based thin-film 12, i.e., sum of the thickness $d_1$ of the first intrinsic thin-film after hydrogen plasma etching, and the thickness $d_2$ of the second intrinsic thin-film may be 3 nm to 15 nm. The thickness of the intrinsic silicon-based thin-film 12 may be 3.5 nm to 12 nm, or 4 nm to 10 nm. When the thickness of the intrinsic silicon-based thin-film is in the above-mentioned range, an increase in interface defects due to, for example, diffusion of impurity atoms to the interface of the single-crystalline silicon substrate during deposition of the conductive silicon-based thin-film can be suppressed, and optical loss and electrical loss resulting from absorption of light by the intrinsic silicon-based thin-film and resistance can be reduced.

In one or more embodiments, the hydrogen plasma etching and deposition of the second intrinsic thin-films are successively performed in the same CVD chamber without taking out the silicon substrate from the chamber midway. When hydrogen plasma etching and deposition of the second intrinsic thin-films are performed in the same CVD chamber, the in-plane distribution of the plasma intensity during hydrogen plasma etching is equivalent to the in-plane distribution of the plasma intensity during deposition of the second intrinsic thin-films. Thus, the second intrinsic thin-films are deposited so as to reduce the thickness distribution of the first intrinsic thin-films after hydrogen plasma etching, so that a variation in thicknesses of the intrinsic silicon-based thin-films can be reduced.

After deposition of the first intrinsic thin-films, in some embodiments hydrogen plasma etching may be performed in the same CVD chamber without taking out the substrate. In this case, it may be possible that plasma discharge is temporarily stopped after deposition of the first intrinsic thin-film and before the start of hydrogen plasma etching. To be more specific, it may be possible that the supply of a source gas is stopped in a state where plasma discharge for depositing the first intrinsic thin-film is stopped, and discharge is resumed to start hydrogen plasma etching after the inside of the chamber is brought into a gas atmosphere containing hydrogen as a main component. When the hydrogen plasma etching is performed without stopping plasma discharge after deposition of the first intrinsic thin-film, an interface layer having a relatively high hydrogen concentration may be formed between the first intrinsic thin-film and the second intrinsic thin-film by a source gas remaining in the chamber, resulting in deterioration of conversion characteristics. In a case where hydrogen plasma etching is performed without stopping plasma discharge after deposition of the first intrinsic thin-film, it may be possible that an atmospheric gas is replaced by discharging the source gas outside the chamber in a short time by a method in which the flow rate of a hydrogen gas is temporarily increased after deposition of the first intrinsic thin-film, etc.

<Conductive Silicon-Based Thin-Film>

As shown in FIG. 2(D), a p-type silicon-based thin-film is formed as the conductive silicon-based thin-film 15 on the intrinsic silicon-based thin-film 12. After deposition of the second intrinsic thin-film 122, the p-type silicon-based thin-film 15 is deposited without interposing other layer therebetween. Thus, the p-type silicon-based thin-film 15 is provided in contact with the second intrinsic thin-film 122 of the intrinsic silicon-based thin-film 12. By providing the conductive silicon-based thin-film in contact with the second intrinsic thin-film deposited at a high hydrogen dilution ratio, junction interface tends to be improved, leading to improvement of conversion characteristics. The thickness of the conductive silicon-based thin-film may be in a range of 3 nm to 20 nm.

In one or more embodiments, after hydrogen plasma etching and deposition of the second intrinsic thin-film are performed in the same CVD chamber, the p-type silicon-based thin-film 15 may be deposited in the same CVD chamber without taking out the substrate from the CVD chamber. By successively depositing the intrinsic silicon-based thin-film and the conductive silicon-based thin-film on the silicon substrate in the same CVD chamber, the process can be simplified to improve production efficiency of the solar cell. When the conductive silicon-based thin-film and the second intrinsic thin-film are deposited in the same CVD chamber, a dopant retained in the chamber may be caught in the second intrinsic thin-film, but the second intrinsic thin-film is not in direct contact with the silicon substrate, and therefore impurities in the second intrinsic thin-film have little influence on the passivation effect on the silicon substrate surface.

A case has been described above where the intrinsic silicon-based thin-film 12 and the p-type silicon-based thin-film 15 are formed on the silicon substrate 1 (formation of a silicon-based thin-film on the p-layer side), as an example. In the manufacturing method of one or more embodiments of the present invention, at least one of formation of the silicon-based thin-film on the p-layer side and formation of the silicon-based thin-film on the n-layer side may be performed by the above-mentioned method. Particularly by forming the silicon-based thin-film on the p-layer side by the above-mentioned method, the conversion characteristics of the solar cell are remarkably improved. Further, when both the silicon-based thin-films on the p-layer side and the n-layer side are formed by the above-mentioned method, an effect of further improving conversion characteristics can be expected.

[Modification of First Intrinsic Thin-Film Formation]

Figure 3:
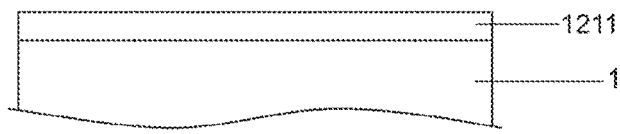
FIGS. 3(A1), 3(A2), 3(A3), 3(B), 3(C) and 3(D) are conceptual views for illustrating a process for forming a silicon-based thin-film on a silicon substrate.
Figure 3:
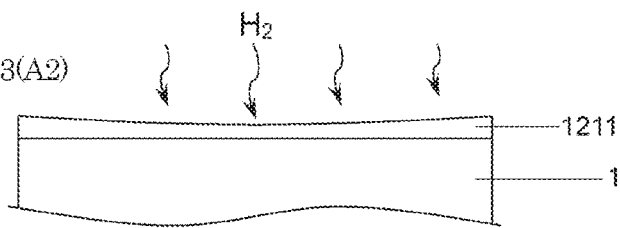
Figure 3:
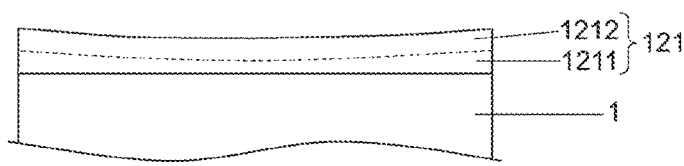

Although the first intrinsic thin-film 121 having a thickness $d_0$ is formed by performing CVD film formation once in one or more embodiments shown in FIGS. 2(A), 2(B), 2(C), and 2(D), formation of the first intrinsic thin-film 121 may be divided into a plurality of times of sublayer deposition processes. FIGS. 3(A1), 3(A2), 3(A3), 3(B), 3(C), and 3(D) are conceptual views illustrating a process for forming a silicon-based thin-film on a silicon substrate. Formation of the first intrinsic thin-film 121 is divided into deposition of two layers, namely a first sublayer 1211 and a second sublayer 1212. First, the first sublayer 1211 of the first intrinsic thin-film is deposited on a principal surface of the silicon substrate 1 (FIG. 3(A1)). Thereafter, the surface of the first sublayer 1211 is subjected to a hydrogen plasma treatment (FIG. 3(A2)) as necessary, and the second sublayer 1212 is deposited on the first sublayer 1211 (FIG. 3(A3)).

In one or more embodiments, the first sublayer and the second sublayer are deposited by plasma-enhanced CVD under the same deposition condition as in deposition of the first intrinsic thin-film. The film quality of the intrinsic silicon-based thin-film can be improved by performing a hydrogen plasma treatment after deposition of the first sublayer 1211 on the silicon substrate 1 and before deposition of the second sublayer. This may be because the film quality improvement is more reliably exerted on the entire thickness of the first intrinsic thin-film as compared to a case where the first intrinsic thin-film is deposited at one time, when the formation of the first intrinsic thin-film is divided into a plurality of times of sublayer deposition in the thickness direction, and a hydrogen plasma treatment is performed after deposition of a sublayer and before deposition of a next sublayer.

The condition for the hydrogen plasma treatment that is performed after deposition of the first sublayer 1211 and before deposition of the second sublayer 1212 (hereinafter, sometimes referred to as an "intermediate hydrogen plasma treatment") is not particularly limited. The condition for the intermediate hydrogen plasma treatment may be the same as that for hydrogen plasma etching on the first intrinsic thin-film.

The deposition thickness of each of the first sublayer 1211 and the second sublayer 1212 may be 8 nm or less, 6 nm or less, 5 nm or less, or 4 nm or less. By decreasing the deposition thickness of each sublayer, the film quality improving effect by hydrogen plasma can be exerted on the entire thickness of the sublayer. The deposition thickness of each of the first sublayer 1211 and the second sublayer 1212 may be 1 nm or more, 1.5 nm or more, or 2 nm or more. When the deposition thickness of each sublayer is excessively small, a coverage failure may easily occur. In addition, when the deposition thickness of each sublayer is excessively small, it is necessary to increase the number of deposition of sublayers required for forming the first intrinsic thin-film 121 having a desired thickness, so that production efficiency tends to be deteriorated.

The thickness of the first sublayer 1211 deposited in direct contact with the silicon substrate 1 may be 1 nm to 6 nm, 1.5 nm to 5 nm, or 2 nm to 4 nm. By performing the intermediate hydrogen plasma treatment after the deposition of the first sublayer 1211, a passivation effect by hydrogen plasma can also be exerted on a surface of the silicon substrate 1 through the first sublayer 1211. In addition, the first sublayer acts as a protecting layer for reducing plasma damage to the silicon surface. Thus, the conversion characteristics of the solar cell tends to be improved by exerting a passivation effect on a surface of the silicon substrate and an effect of reducing defects at the interface between the silicon substrate and the intrinsic silicon-based thin-film while suppressing plasma damage to the silicon substrate.

Figure 3B:
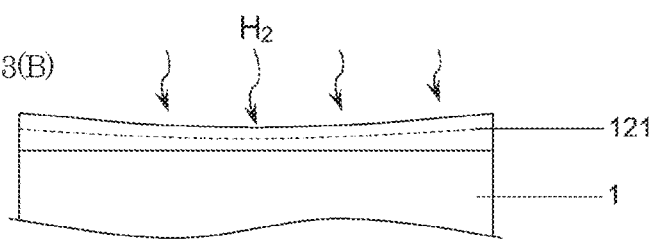
Figure 3C:
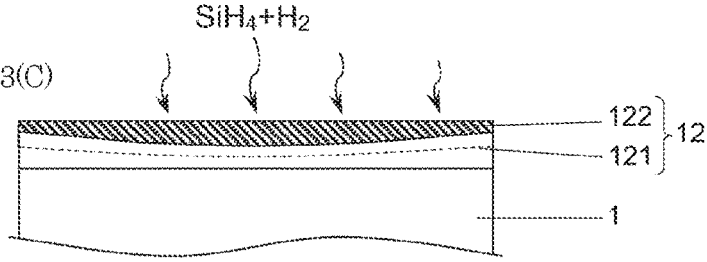
Figure 3D:
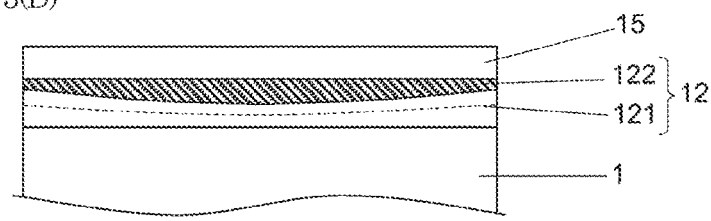

After the first sublayer 1211 is subjected to a hydrogen plasma treatment, the second sublayer 1212 is deposited. On the first intrinsic thin-film 121 including these two sublayers, hydrogen plasma etching is performed (FIG. 3(B)) in the same manner as shown in FIG. 2(B), and deposition of the second intrinsic thin-film 122 (FIG. 3(C)) and deposition of the p-type silicon-based thin-film 15 (FIG. 3(D)) are performed in the same manner as shown in FIGS. 2(C) and 2(D).

FIGS. 3(A1), 3(A2), 3(A3), 3(B), 3(C), and 3(D) show an example in which the first intrinsic thin-film is formed by depositing two sublayers. The first intrinsic thin-film may be formed by stacking three or more sublayers. When the number "n" of stacked sublayers ("n" is an integer of 2 or more) is excessively large, series resistance may increase due to a thickness increase of the intrinsic silicon-based thin-film, leading to deterioration of the fill factor of the solar cell. In addition, when the number n of stacked sublayers is large, production efficiency of the solar cell is deteriorated. Thus, n may be 2 to 4, 2 to 3, or 2.

In one or more embodiments, when the formation of the first intrinsic thin-film is divided into deposition of n sublayers including first to $n^{th}$ sublayers in this order from the silicon substrate side, the hydrogen plasma etching is performed after deposition of the $n^{th}$ sublayer. In addition, it may be possible that an intermediate hydrogen plasma treatment is performed in which the surface of any one of the first to $(n-1)^{th}$ sublayers is exposed to hydrogen plasma after deposition of each of the sublayers.

In some embodiments, when n is 3 or more, only one sublayer may be subjected to an intermediate hydrogen plasma treatment, or a plurality of sublayers may be subjected to an intermediate hydrogen plasma treatment. For example, when n is 3, an intermediate hydrogen plasma treatment may be performed after deposition of the first sublayer, and the third sublayer may be deposited without performing a hydrogen plasma treatment after deposition of the second sublayer. In addition, an intermediate hydrogen plasma treatment may be performed after deposition of the first sublayer and after deposition of the second sublayer, respectively. The second sublayer may be deposited without performing a hydrogen plasma treatment after deposition of the first sublayer, and an intermediate hydrogen plasma treatment may be performed after deposition of the second sublayer and before deposition of the third sublayer. It may also be possible that the surface of the first sublayer is subjected to an intermediate hydrogen plasma treatment when n is 3 or more. When the surface of the first sublayer is subjected to an intermediate hydrogen plasma treatment, the passivation effect on the silicon substrate surface and the effect of reducing defects at the interface between the silicon substrate and the intrinsic silicon-based thin-film tend to be improved.

When the formation of the first intrinsic thin-film 121 is divided into deposition of n sublayers in some embodiments, and an intermediate hydrogen plasma treatment is performed after deposition of each of the sublayers, the total of the plasma etching amount in the intermediate plasma treatment and the plasma etching amount in hydrogen plasma etching after deposition of the $n^{th}$ sublayer (total plasma etching amount) may be equivalent to the deposition thickness $d_2$ of the second intrinsic thin-film. The deposition thickness $d_2$ of the second intrinsic thin-film may be 0.5 to 2 times, 0.6 to 1.5 times, or 0.7 to 1.3 times the total plasma etching amount. When the total plasma etching amount is equivalent to the deposition thickness $d_2$ of the second intrinsic thin-film, the second intrinsic thin-film is formed so as to compensate for the in-plane distribution of the plasma etching amount, and therefore a variation in thicknesses of the intrinsic silicon-based thin-films within one batch or among batches can be reduced.

In one or more embodiments, the total plasma etching amount may be 0.5 to 5 nm, 0.8 to 4 nm, or 1 to 3 nm. The plasma etching amount in the intermediate plasma treatment may be 0.3 nm or more, or 0.5 nm or more. On the other hand, when the plasma etching amount in the intermediate plasma treatment is excessively large, the thickness distribution of the first intrinsic thin-films may increase to the extent that it is unable to sufficiently compensate for the thickness distribution even when the second intrinsic thin-films are formed. Thus, the plasma etching amount in the intermediate plasma treatment may be 3 nm or less, or 2 nm or less.

[Transparent Electroconductive Layer]

Transparent electroconductive layers 17 and 27 are formed on the conductive silicon-based thin-films 15 and 25, respectively. The transparent electroconductive layers are made of conductive oxide. As the conductive oxide, for example, zinc oxide, indium oxide and tin oxide can be used alone or in combination. Further, an electroconductive dopant may be added to these conductive oxides. Examples of the dopant added to zinc oxide include aluminum, gallium, boron, silicon and carbon. Examples of the dopant added to indium oxide include zinc, tin, titanium, tungsten, molybdenum and silicon. Examples of the dopant added to tin oxide include fluorine. The conductive oxide layer may be deposited as a single film, or deposited as a stack of films.

In some embodiments, the thickness of each of the transparent electrode layers 17 and 27 may be 10 nm or more and 140 nm or less from the viewpoints of transparency and electroconductivity. It suffices that the transparent electrode layer has electroconductivity required for transportation of a carrier to the collecting electrode. If the thickness of the transparent electrode layer is too large, the transmittance may be reduced due to the absorption losses of the transparent electrode layer itself thus causing degradation of photoelectric conversion efficiency.

As the method for forming the transparent electroconductive layer, a physical vapor deposition method such as a sputtering method, chemical vapor deposition (MOCVD) using a reaction of an organic metal compound with oxygen or water, or the like may be possible. In any deposition method, energy from heat, plasma discharge or the like may be used for deposition.

[Collecting Electrode]

Collecting electrodes 19 and 29 are formed on the transparent electroconductive layers 17 and 27, respectively. A metal such as silver, copper, gold, aluminum or tin is used as a material of the collecting electrode. The collecting electrode on the light-receiving side is formed in a pattern shape. The collecting electrode on the back side may be formed over the whole surface of the transparent electroconductive layer or formed in a pattern shape. The pattern-shaped collecting electrode can be formed by application of an electroconductive paste, plating or the like. Examples of the method for applying an electroconductive paste on the transparent electroconductive layer include printing methods such as an inkjet printing method and a screen printing method, and a spray method.

[Modularization]

In one or more embodiments, the crystalline silicon-based solar cell may be modularized when put into practical use. Modularization of the solar cell is performed by an appropriate method. For example, by connecting a bus bar of the collecting electrode via an interconnector such as a TAB, a plurality of solar cells are connected in series or in parallel to form a solar cell string. A wiring for electrically connecting the solar cell or solar cell string to an external line is connected and encapsulated with an encapsulant and a glass plate or the like to obtain a solar cell module.

In a solar cell module in which a plurality of cells are connected in series and/or in parallel, module efficiency depends on characteristics of a cell having the poorest characteristics. According to the manufacturing method of one or more embodiments of the present invention, a crystalline silicon-based solar cell having excellent conversion characteristics and a reduction of conversion characteristic variation within one batch or among batches can be attained as described above. When a plurality of cells obtained by the manufacturing method of one or more embodiments of the present invention are modularized, module efficiency can be kept high because of a reduced variation in voltage and current between cells.

EXAMPLES

Examples of one or more embodiments of the present invention will be specifically described below, but the present invention is not limited to the Examples below.

[Measurement Method]

The thickness of a thin-film formed on a silicon substrate having no texture on the surface thereof was measured using a spectroscopic ellipsometer (Model No. M2000, manufactured by J. A Woollam Co., Inc.). Fitting was performed by Tauc-Lorentz Model. The thickness of a thin-film formed on a silicon substrate having a texture on the surface thereof was determined by observing a cross-section with a transmission electron microscope (TEM). For a layer formed on a silicon substrate surface having a texture, a direction perpendicular to the slope of the texture was defined as a thickness direction.

Deposition Experimental Example: Evaluation of Thickness Variation Caused by Plasma Treatment By a plasma-enhanced CVD, an amorphous silicon thin-films were deposited on flat silicon substrates having no texture on their surfaces, and a variation in thicknesses depending on a position on a deposition tray was examined. A 200 μm-thick 6-inch n-type single-crystalline silicon wafer having a plane orientation of (100) was washed in acetone, then immersed in a 2 wt % HF aqueous solution for 3 minutes to remove a silicon oxide film on a surface of the wafer, rinsed with ultrapure water. This cleaned wafer was used as silicon substrate in the Experimental Examples below.

Experimental Example 1

(Deposition in First Batch)

A silicon substrate was mounted at each of an in-plane central portion (3,3-address) and an end portion (1,1-address) on a deposition tray (tray area: 0.93 m$^2$, deposition surface area: 0.67 m$^2$) on which 25 silicon substrates (5 (lines)×5 (rows)) were mountable. A tray having silicon substrates mounted thereon was introduced into a CVD chamber, and deposition was performed for 15 seconds under the condition of a substrate temperature of 150° C., a pressure of 120 Pa, a $H_2/SiH_4$ flow rate ratio of 10/3 and a power density of 11 mW/cm$^2$ (hereinafter, the condition is referred to as a "low hydrogen dilution ratio condition") to form an intrinsic silicon thin-film (first sublayer) having a thickness of about 3.5 nm.

After deposition of the first sublayer, plasma discharge was temporarily stopped. The supply of $SiH_4$ was stopped, and only a hydrogen gas was introduced into the CVD chamber to perform gas replacement. After gas replacement was performed for 30 seconds, plasma discharge was resumed. A hydrogen plasma treatment was performed under the condition of a substrate temperature of 150° C., a pressure of 520 Pa and a power density of 200 mW/cm$^2$ (hereinafter, the condition is referred to as a "strong plasma treatment condition").

After the hydrogen plasma treatment was performed for 20 seconds, plasma discharge was temporarily stopped, and $SiH_4$ was introduced into the CVD chamber so that the $H_2/SiH_4$ flow rate ratio was set to 10/3, thereby performing gas replacement. Thereafter, plasma discharge was resumed, and deposition was performed for 15 seconds under the low hydrogen dilution ratio condition to form an intrinsic silicon thin-film (second sublayer) having a thickness of about 3.5 nm on the first sublayer after the plasma treatment. In this way, a first intrinsic silicon thin-film including a first sublayer and a second sublayer and having a thickness of about 6 nm was formed. The reason why the thickness of the first intrinsic silicon thin-film was smaller than the total deposition thickness of the first sublayer and the second sublayer is that the first sublayer was etched by the plasma treatment after deposition of the first sublayer, leading to a decrease in thickness.

After deposition of the first intrinsic silicon thin-film, plasma discharge was temporarily stopped. The supply of $SiH_4$ was stopped, and thus only a hydrogen gas was introduced into the CVD chamber to perform gas replacement for about 30 seconds. Thereafter, plasma discharge was resumed, and a hydrogen plasma treatment was performed for 20 seconds under the strong plasma treatment condition.

Thereafter, plasma discharge was temporarily stopped, and $SiH_4$ was introduced into the CVD chamber so that the $H_2/SiH_4$ flow rate ratio was set to 300/1, thereby performing gas replacement. Thereafter, plasma discharge was resumed, and deposition was performed for 80 seconds under the condition of a substrate temperature of 150° C., a pressure of 520 Pa and a power density of 200 mW/cm$^2$ (hereinafter, the condition is referred to as a "high hydrogen dilution ratio condition") to form a second intrinsic silicon thin-film having a thickness of about 2 nm.

On the second intrinsic silicon thin-film, a p-type silicon thin-film having a thickness of about 4 nm was deposited under the condition of a substrate temperature of 150° C., a pressure of 60 Pa, a $B_2H_6$-containing $H_2/SiH_4$ flow rate ratio of 3/1 and a power density of 11 mW/cm$^2$. As $B_2H_6$-containing $H_2$, a mixed gas with the $B_2H_6$ concentration reduced to 5000 ppm by dilution with $H_2$ was used.

(Deposition in Second to Ninth Batches)

After completion of deposition in the first batch, the deposition tray was taken out from the CVD apparatus, another silicon substrate was mounted at each of the in-plane central portion and the end portion on the deposition tray, and deposition in the second batch was performed. In deposition in the second batch, a series of operations including formation of a first intrinsic silicon thin-film under the low hydrogen dilution ratio condition (deposition of a 3.5 nm-first sublayer, strong plasma treatment and deposition of a 3.5-nm second sublayer), hydrogen plasma treatment under the strong plasma treatment condition, deposition of a second intrinsic silicon thin-film under the high hydrogen dilution ratio condition of a hydrogen dilution ratio of 300, and deposition of a p-type silicon thin-film were performed as in the first batch. The series of operations were repeated until deposition in the ninth batch was completed.

(Deposition and Thickness Measurement in Tenth Batch)

In deposition in the tenth batch, deposition of a first intrinsic silicon thin-film under the low hydrogen dilution ratio condition, hydrogen plasma treatment under the strong plasma treatment condition, and deposition of a second intrinsic silicon thin-film under the high hydrogen dilution ratio condition of a hydrogen dilution ratio of 300 were performed in the same manner as in the first to ninth batches. Thereafter, the deposition tray was taken out from the CVD apparatus without forming a p-type silicon thin-film. The thickness of the intrinsic silicon thin-film in the vicinity of the center of the silicon substrate mounted at each of the central portion and the end portion of the tray was measured by spectroscopic ellipsometry.

(Deposition and Thickness Measurement in 11th to 1000th Batches)

A series of operations were repeated under the same condition as in the first to ninth batches to perform deposition in 11th to 999th batches. Thereafter, in deposition in the 1000th batch, as in the case of the tenth batch, the deposition tray was taken out from the CVD apparatus without forming a p-type silicon thin-film and the thickness of the intrinsic silicon thin-film was measured.

Experimental Examples 2 and 3 and Comparative Experimental Example 1

The introduction amount of $SiH_4$ was changed so that $H/SiH_4$ flow rate ratio was 100/1 (Experimental Example 2), 60/1 (Experimental Example 3) and 30/1 (Comparative Experimental Example 1) under the high hydrogen dilution ratio condition of high hydrogen dilution during deposition of the second intrinsic silicon thin-film. The deposition time was changed to 50 seconds (Experimental Example 2), 24 seconds (Experimental Example 2) and 12 seconds (Comparative Experimental Example 1) as the deposition rate was changed. Deposition of silicon thin-films on silicon substrates was repeated in the same manner as in Experimental Example 1 except that the condition for deposition of the second intrinsic silicon thin-film was changed. The thickness of each of intrinsic silicon thin-films in the tenth and 1000th batches was measured.

Experimental Example 4

A first intrinsic silicon thin-film having a thickness of about 6 nm was formed by performing deposition for 25 seconds under the low hydrogen dilution ratio condition without performing a hydrogen plasma treatment midway during deposition of a first intrinsic silicon thin-film. Thereafter, a hydrogen plasma treatment under the strong plasma treatment condition, deposition of a second intrinsic silicon thin-film under the high hydrogen dilution ratio condition with hydrogen dilution ratio of 300, and deposition of a p-type silicon thin-film were performed in the same manner as in Experimental Example 1. In Experimental Example 4, the deposition time for the second intrinsic silicon thin-film was changed to 40 seconds, and the thickness of the second intrinsic silicon thin-film was about 1 nm. The series of operations were repeated to measure the thickness of each of intrinsic silicon thin-films in the tenth and 1000th batches. In the 1000th batch, the deposition tray was temporarily taken out from the CVD apparatus, and the thickness of a silicon thin-film in the vicinity of the center of the substrate was measured after formation of a first intrinsic silicon thin-film and before hydrogen plasma treatment, and after hydrogen plasma treatment and before formation of a second intrinsic silicon thin-film.

Comparative Experimental Example 2

As in Experimental Example 4, a first intrinsic silicon thin-film having a thickness of about 6 nm was formed by performing deposition for 25 seconds under the low hydrogen dilution ratio condition without performing a hydrogen plasma treatment midway. A hydrogen plasma treatment was performed for 20 seconds under the strong plasma treatment condition, and deposition was then performed for 4 seconds under the low hydrogen dilution ratio condition to form a second intrinsic silicon thin-film. A p-type silicon thin-film was deposited on the second intrinsic silicon thin-film under the same condition as in Experimental Example 1. The series of operations were repeated to measure the thickness of each of intrinsic silicon thin-films in the tenth and 1000th batches. In the 1000th batch, the thickness of the silicon thin-film was measured after formation of the first intrinsic silicon thin-film and before hydrogen plasma treatment, and after hydrogen plasma treatment and before formation of the second intrinsic silicon thin-film as in Experimental Example 4.

Comparative Experimental Example 3

Formation of a first intrinsic silicon thin-film under the low hydrogen dilution ratio condition and hydrogen plasma treatment under the strong plasma treatment condition were performed as in Experimental Example 1, a second intrinsic silicon thin-film was then formed under the low hydrogen dilution ratio condition as in Comparative Experimental Example 2, and a p-type silicon thin-film was formed thereon. The series of operations were repeated to measure the thickness of each of intrinsic silicon thin-films in the tenth and 1000th batches.

Comparative Experimental Example 4

Formation of a first intrinsic silicon thin-film under the low hydrogen dilution ratio condition and hydrogen plasma treatment under the strong plasma treatment condition were performed for 20 seconds as in Experimental Example 1, a second intrinsic silicon thin-film was then formed under the low hydrogen dilution ratio condition as in Comparative Experimental Example 2, and a p-type silicon thin-film was formed thereon. The series of operations were repeated to measure the thickness of each of intrinsic silicon thin-films in the tenth and 1000th batches.

Comparative Experimental Example 5

The hydrogen plasma treatment condition in the middle of formation of a first intrinsic silicon thin-film and the hydrogen plasma treatment condition after deposition of the first intrinsic silicon thin-film were changed to the condition of a pressure of 120 Pa, a power density of 26 $mW/cm^2$ and a treatment time of 60 seconds (hereinafter, this condition is referred to as a "weak plasma treatment condition"). Except that a plasma treatment was performed under the weak plasma treatment condition, and the deposition time for each of a first sublayer and a second sublayer was changed to 13 seconds, the same procedure as in Experimental Example 1 was carried out to form a first intrinsic silicon thin-film under the low hydrogen dilution ratio condition, and to perform a hydrogen plasma treatment. Thereafter, as in Comparative Experimental Example 4, a p-type silicon thin-film was deposited on the first intrinsic silicon thin-film without forming a second intrinsic silicon thin-film. The series of operations were repeated to measure the thickness of each of intrinsic silicon thin-films in the tenth and 1000th batches. In the 1000th batch, the deposition tray was temporarily taken out from the CVD apparatus, and the thickness of a silicon thin-film was measured after formation of a first intrinsic silicon thin-film and before hydrogen plasma treatment.

Comparative Experimental Example 6

As in Experimental Example 4, a first intrinsic silicon thin-film having a thickness of about 6 nm was formed by performing deposition for 25 seconds under the low hydrogen dilution ratio condition without performing a hydrogen plasma treatment midway. Thereafter, a p-type silicon thin-film was formed thereon without performing a hydrogen plasma treatment and formation of the second intrinsic silicon thin-film. The series of operations were repeated to measure the thickness of each of intrinsic silicon thin-films in the tenth and 1000th batches.

<Evaluation Results>

Table 1 shows the substrate temperature, pressure, power density hydrogen dilution ratio, deposition rate and treatment time under the "low hydrogen dilution ratio condition", "high hydrogen dilution ratio condition", "strong plasma treatment condition" and "weak plasma treatment condition" in a list.

TABLE 1

|  | Low hydrogen dilution ratio condition | High hydrogen dilution ratio condition | | | | Strong plasma treatment condition | Weak plasma processing conditions |
| --- | --- | --- | --- | --- | --- | --- | --- |
| Substrate temperature (° C.) | 150 | 150 | | | | 150 | 150 |
| Pressure (Pa) | 120 | 520 | | | | 520 | 120 |
| Power density (mW/cm$^2$) | 11 | 200 | | | | 200 | 26 |
| H$_2$/SiH$_4$ | 3.3 | 30 | 60 | 100 | 300 | ∞ | ∞ |
| Deposition rate (nm/sec) | 0.23 | 0.15 | 0.07 | 0.03 | 0.02 | — | — |
| Plasma treatment time (sec) | — | — | | | | 20 | 60 |

Table 2 shows deposition conditions and thickness measurement results for intrinsic silicon thin-films in Experimental Examples and Comparative Experimental Examples. For the thicknesses variation within one batch, a difference between a thickness (Te) of an intrinsic silicon thin-film deposited on a substrate at a tray end portion and a thickness (Tc) of an intrinsic silicon thin-film deposited on a substrate at a tray central portion in each batch is expressed in terms of a percentage. For the thicknesses variation among batches, a difference between a thickness ($T_{10}$) in the tenth batch and a thickness ($T_{100}$) in the 1000th batch is expressed in terms of a percentage.

thickness variation within batch (%)=100×(Te−Tc)/Tc thickness variation among batches (%)=100×($T_{10}$−$T_{1000}$)/$T_{1000}$

TABLE 2

| | Deposition condition | | | | Thickness | | |
| --- | --- | --- | --- | --- | --- | --- | --- |
| | Plasma treatment in middle of formation of first thin-film | Plasma treatment after deposition of first thin-film | Second thin-film deposition condition (H$_2$/SiH$_4$) | Substrate position | Tenth batch | 1000th batch | Thickness variation among batches (%) |
| Experimental Example 1 | Strong plasma | Strong plasma | High hydrogen dilution ratio (300) | End portion (nm) Central portion (nm) Thickness variation within batch (%) | 6.16 6.13 0.5 | 6.06 6.02 0.7 | 1.7 1.8 |
| Experimental Example 2 | Strong plasma | Strong plasma | High hydrogen dilution ratio (100) | End portion (nm) Central portion (nm) Thickness variation within batch (%) | 6.16 6.12 0.7 | 6.16 6.10 1.0 | 0.0 0.3 |
| Experimental Example 3 | Strong plasma | Strong plasma | High hydrogen dilution ratio (60) | End portion (nm) Central portion (nm) Thickness variation within batch (%) | 6.21 6.15 1.0 | 6.18 6.11 1.1 | 0.5 0.7 |
| Comparative Experimental Example 1 | Strong plasma | Strong plasma | High hydrogen dilution ratio (30) | End portion (nm) Central portion (nm) Thickness variation within batch (%) | 6.21 6.16 0.8 | 6.19 6.10 1.5 | 0.3 1.0 |
| Experimental Example 4 | — | Strong plasma | High hydrogen dilution ratio (300) | End portion (nm) Central portion (nm) Thickness variation within batch (%) | 6.17 6.15 0.3 | 6.09 6.07 0.3 | 1.3 1.3 |
| Comparative Experimental Example 2 | — | Strong plasma | Low hydrogen dilution ratio (3.3) | End portion (nm) Central portion (nm) Thickness variation within batch (%) | 6.23 6.16 1.1 | 6.15 5.68 8.3 | 1.3 8.5 |
| Comparative Experimental Example 3 | Strong plasma | Strong plasma | Low hydrogen dilution ratio (3.3) | End portion (nm) Central portion (nm) Thickness variation within batch (%) | 6.23 6.08 2.5 | 6.19 5.52 12.1 | 0.6 10.1 |
| Comparative Experimental Example 4 | Strong plasma | Strong plasma | — | End portion (nm) Central portion (nm) Thickness variation within batch (%) | 6.17 5.93 4.0 | 6.11 5.31 15.1 | 1.0 11.7 |
| Comparative Experimental Example 5 | Weak plasma | Weak plasma | — | End portion (nm) Central portion (nm) Thickness variation within batch (%) | 6.16 6.10 1.0 | 6.16 6.03 2.2 | 0.0 1.2 |
| Comparative Experimental Example 6 | — | — | — | End portion (nm) Central portion (nm) Thickness variation within batch (%) | 6.23 6.19 0.6 | 6.08 6.03 0.8 | 2.5 2.7 |

The followings can be understood from the results in Table 2. In Comparative Experimental Examples 2 and 3, where the first intrinsic silicon thin-film was deposited, the hydrogen plasma treatment was then performed under the strong plasma treatment condition, and the second intrinsic silicon thin-film was then deposited under the low hydrogen dilution ratio condition, there was a markedly large variation between the thickness at an end portion and the thickness at a central portion in the 1000th batch. In Comparative Experimental Example 4 where the hydrogen plasma treatment was performed under the strong plasma treatment condition, and the second intrinsic silicon thin-film was not formed, there was a markedly large variation between the thickness at an end portion and the thickness at a central portion in the 1000th batch. On the other hand, in Experimental Examples 1 to 4 where the hydrogen plasma treatment was performed under the strong plasma treatment condition, and the second intrinsic silicon thin-film was then deposited under the high hydrogen dilution ratio condition, the thickness variation within one batch was about 1% or less in the 1000th batch.

Table 3 shows the results of measuring the thickness of the amorphous silicon thin-film before and after the plasma treatment in the 1000th batch in Experimental Example 4 and Comparative Experimental Examples 2 and 5.

plasma intensity identical to that in the high plasma treatment, the variation between the thickness at the central portion and the thickness at the end portion after deposition of the second intrinsic silicon thin-film was reduced. This is because a plasma intensity distribution occurs during deposition of the second intrinsic silicon thin-film as in the case for the plasma treatment, and thus the deposition rate is higher at the central portion than at the end portion.

To be more specific, it is considered that a silicon thin-film is formed so as to compensate for the in-plane distribution of the plasma etching amount by performing deposition under the high hydrogen dilution ratio deposition condition, and therefore the thickness distribution is reduced, in spite that an in-plane distribution of the plasma etching amount occurs, with an increase in the number of continuous deposition batches, due to an in-plane distribution of the plasma intensity. It is considered that in Experimental Examples 1 to 3 where the second intrinsic silicon thin-film was deposited under the high hydrogen dilution ratio condition, the thickness variation in the 1000th batch was reduced as

TABLE 3

| | Deposition condition | | | Thickness in $1000^{th}$ batch | | | |
|---|---|---|---|---|---|---|---|
| | Plasma treatment in middle of formation of first thin-film | Plasma treatment after deposition of first thin-film | Second thin-film deposition condition ($H_2/SiH_4$) | Substrate position | Before plasma treatment | After plasma treatment | After deposition of second thin-film |
| Experimental Example 4 | — | Strong plasma | High hydrogen dilution ratio (300) | End portion (nm) Central portion (nm) Thickness variation (%) | 6.07 6.04 0.5 | 5.26 4.87 8.0 | 6.06 6.02 0.7 |
| Comparative Experimental Example 2 | — | Strong plasma | Low hydrogen dilution ratio (3.3) | End portion (nm) Central portion (nm) Thickness variation (%) | 6.21 6.06 2.5 | 5.35 4.86 10.1 | 6.15 5.68 8.3 |
| Comparative Experimental Example 5 | Weak plasma | Weak plasma | — | End portion (nm) Central portion (nm) Thickness variation (%) | 6.16 6.09 1.1 | 6.16 6.03 2.2 | |

Table 3 shows that in each of Experimental Examples and comparative Experimental Examples, the central portion tends to be more easily etched by hydrogen plasma as compared to the end portion in the 1000th batch. In Comparative Experimental Example 5 where the weak plasma treatment was performed, the difference between the thickness at the end portion and the thickness at the central portion was very small, whereas in Experimental Example 4 and Comparative Experimental Example 2 where the strong plasma treatment was performed, the thickness at the central portion tended to markedly decrease. These results indicate that when deposition is successively performed multiple times without carrying out maintenance of the CVD apparatus, influences of film accumulation in the chamber, etc. cause a plasma intensity distribution, and the plasma intensity difference between the central portion and the end portion increases particularly at a high plasma power.

In Comparative Experimental Example 2 where the hydrogen plasma treatment was performed under the strong plasma treatment condition and the second intrinsic silicon thin-film was then deposited under the low hydrogen dilution ratio condition, the thickness distribution was hardly improved. On the other hand, in Experimental Example 4 where the second intrinsic silicon thin-film was deposited under the high hydrogen dilution ratio condition with a compared to Comparative Experimental Example 4 on the basis of the same principle as described above.

Preparation Example of Solar Cell

<Formation of Texture on Silicon Substrate>

A 200 μm-thick 6-inch n-type single-crystalline silicon wafer having a plane orientation of (100) was washed in acetone, then immersed in a 2 wt % HF aqueous solution for 3 minutes to remove a silicon oxide film on a surface of the wafer, and rinsed with ultrapure water. The washed silicon substrate was immersed in a 5/15 wt % KOH/isopropyl alcohol aqueous solution at 70° C. for 15 minutes, and rinsed with ultrapure water to obtain a single-crystalline silicon substrate with pyramidal texture having a (111) plane exposed on its surface.

In the following Examples and Comparative Examples, a silicon thin-film was formed, under the same condition as in the Experimental Examples and Comparative Experimental Examples, on silicon substrate having texture thereon. In Examples and Comparative Examples, the time for deposition of the silicon thin-film and the plasma treatment was set to 1.5 times that in the Experimental Examples and Comparative Experimental Examples in consideration of the fact that the surface area of a substrate having texture on a silicon substrate surface is about 1.5 times the surface area of the substrate before formation of the texture.

Example 1

(CVD Film Formation on p-Layer Side)

A textured silicon substrate was mounted at each of an in-plane central portion (3,3-address) and an end portion (1,1-address) on a deposition tray on which 25 silicon substrates (5 (lines)×5 (rows)) were mountable. A tray with a silicon substrate mounted thereon was introduced into a CVD chamber, and on the silicon substrate, formation of a first intrinsic silicon thin-film under the low hydrogen dilution ratio condition (deposition of a 3.5 nm-first sublayer, strong plasma treatment and deposition of a 3.5-nm second sublayer), hydrogen plasma treatment under the strong plasma treatment condition, deposition of a second intrinsic silicon thin-film under the high hydrogen dilution ratio condition of a hydrogen dilution ratio of 300, and deposition of a p-type silicon thin-film were performed under the same condition as in Experimental Example 1. The tray was replaced, and deposition was performed in 1000 batches under the same condition as described above.

(Preparation of Solar Cell)

Among substrates on which the silicon thin-film was formed on the p-layer side, four substrates in the tenth batch and the 1000th batch were taken out, and a heterojunction solar cell was prepared. An intrinsic silicon thin-film having a thickness of 6 nm was deposited on a silicon thin-film-non-formed surface (back side) of the silicon substrate under the low hydrogen dilution ratio condition, and an n-type silicon thin-film having a thickness of about 4 nm was deposited thereon under the condition of a substrate temperature of 150° C., a pressure of 60 Pa, a $PH_3$-containing $H_2/SiH_4$ flow rate ratio of 3/1 and a power density of 11 mW/cm$^2$. As $PH_3$-containing $H_2$, a mixed gas with the $PH_3$ concentration reduced to 5000 ppm by dilution with $H_2$ was used.

An ITO transparent electroconductive film having a thickness of 80 nm was deposited on each of the n-type silicon thin-film and the p-type silicon thin-film. The transparent electroconductive film was deposited under the condition of a substrate temperature of 150° C., an argon/oxygen flow rate of 50 sccm/1 sccm, a pressure of 0.2 Pa and a power density of 0.5 W/cm$^2$ by a sputtering method using an ITO sintered target having a tin oxide content of 5% by weight. A silver paste was applied in a comb shape on the transparent electroconductive layer by screen printing, and heated at 150° C. for 1 hour to obtain a solar cell for evaluation.

Examples 2 to 4 and Comparative Examples 1 to 6

The condition for CVD film formation on the p-layer side was changed to the same condition as in Experimental Examples 2 to 4 and Comparative Experimental Examples 1 to 6 (the time for deposition and plasma treatment of the silicon thin-film was 1.5 times as much as that in the Experimental Examples and Comparative Experimental Examples). Deposition was performed in 1000 batches in the same manner as in Example 1 except for the above, and solar cells for evaluation were prepared using the substrates in the tenth batch and the 1000th batch.

<Evaluation Results>

The power generation characteristics of the solar cell obtained in each of Examples and Comparative Examples were measured under photoirradiation with an AM of 1.5 and 100 mW/cm$^2$ at a temperature of 25° C. In Table 4, the open circuit voltage (Voc), the short circuit current (Isc), the fill factor (FF) and the maximum power (Pmax) are each shown as a relative value where the value for a cell in the tenths batch (a cell obtained by performing deposition at the tray end portion) in Comparative Example 6 is set to 1. The "difference" in Table 4 is a difference between the value at the end portion and the value at the central portion in the same batch, and ΔPmax is a difference between Pmax of the cell in the tenth batch and Pmax of the cell in the 1000th batch.

TABLE 4

| | Intrinsic silicon layer on p•layer side | | | | Conversion characteristics (relative values) | | | | | | | | |
|---|---|---|---|---|---|---|---|---|---|---|---|---|---|
| | Plasma treatment in middle of formation of first thin-film | Plasma treatment after deposition of first thin-film | Second thin-film deposition condition ($H_2/SiH_4$) | Substrate position | Tenth batch | | | | 1000th batch | | | | ΔPmax |
| | | | | | Voc | Isc | FF | Pmax | Voc | Isc | FF | Pmax | |
| Example 1 | Strong plasma | Strong plasma | High hydrogen dilution ratio (300) | End portion | 1.067 | 1.014 | 1.025 | 1.109 | 1.065 | 1.004 | 1.035 | 1.107 | 0.002 |
| | | | | Central portion | 1.065 | 1.014 | 1.030 | 1.112 | 1.055 | 1.008 | 1.035 | 1.101 | 0.011 |
| | | | | Difference | 0.002 | 0.000 | −0.005 | −0.003 | 0.010 | −0.004 | 0.000 | 0.006 | |
| Example 2 | Strong plasma | Strong plasma | High hydrogen dilution ratio (100) | End portion | 1.065 | 1.004 | 1.022 | 1.093 | 1.065 | 1.004 | 1.022 | 1.093 | 0.000 |
| | | | | Central portion | 1.051 | 1.012 | 1.030 | 1.095 | 1.049 | 1.008 | 1.030 | 1.089 | 0.006 |
| | | | | Difference | 0.014 | −0.008 | −0.008 | −0.002 | 0.016 | −0.004 | −0.008 | 0.004 | |
| Example 3 | Strong plasma | Strong plasma | High hydrogen dilution ratio (60) | End portion | 1.055 | 1.004 | 1.025 | 1.086 | 1.055 | 1.004 | 1.025 | 1.086 | 0.000 |
| | | | | Central portion | 1.051 | 1.012 | 1.025 | 1.090 | 1.048 | 1.012 | 1.025 | 1.087 | 0.003 |
| | | | | Difference | 0.004 | −0.008 | 0.000 | −0.004 | 0.007 | −0.008 | 0.000 | −0.001 | |

TABLE 4-continued

| | Intrinsic silicon layer on p•layer side | | | | Conversion characteristics (relative values) | | | | | | | | | |
|---|---|---|---|---|---|---|---|---|---|---|---|---|---|---|
| | Plasma treatment in middle of formation of first thin-film | Plasma treatment after deposition of first thin-film | Second thin-film deposition condition ($H_2/SiH_4$) | Substrate position | Tenth batch | | | | 1000th batch | | | | | |
| | | | | | Voc | Isc | FF | Pmax | Voc | Isc | FF | Pmax | ΔPmax |
| Comparative Example 1 | Strong plasma | Strong plasma | High hydrogen dilution ratio (30) | End portion | 1.049 | 1.004 | 1.013 | 1.067 | 1.045 | 1.004 | 1.015 | 1.065 | 0.002 |
| | | | | Central portion | 1.051 | 1.006 | 1.015 | 1.073 | 1.045 | 1.004 | 1.013 | 1.063 | 0.010 |
| | | | | Difference | −0.002 | −0.002 | −0.002 | −0.006 | 0.000 | 0.000 | 0.002 | 0.002 | |
| Example 4 | — | Strong plasma | High hydrogen dilution ratio (300) | End portion | 1.055 | 1.006 | 1.030 | 1.093 | 1.049 | 1.006 | 1.030 | 1.087 | 0.006 |
| | | | | Central portion | 1.045 | 1.006 | 1.032 | 1.085 | 1.045 | 1.006 | 1.039 | 1.092 | −0.007 |
| | | | | Difference | 0.010 | 0.000 | −0.002 | 0.008 | 0.004 | 0.000 | −0.009 | −0.005 | |
| Comparative Example 2 | — | Strong plasma | Low hydrogen dilution ratio (3.3) | End portion | 1.055 | 1.004 | 1.017 | 1.077 | 1.045 | 1.004 | 1.015 | 1.065 | 0.012 |
| | | | | Central portion | 1.051 | 1.006 | 1.015 | 1.073 | 1.025 | 1.004 | 1.009 | 1.038 | 0.035 |
| | | | | Difference | 0.004 | −0.002 | 0.002 | 0.004 | 0.020 | 0.000 | 0.006 | 0.027 | |
| Comparative Example 3 | Strong plasma | Strong plasma | Low hydrogen dilution ratio (3.3) | End portion | 1.055 | 1.004 | 1.017 | 1.077 | 1.045 | 1.004 | 1.015 | 1.065 | 0.012 |
| | | | | Central portion | 1.045 | 1.006 | 1.015 | 1.067 | 1.015 | 1.004 | 1.009 | 1.028 | 0.039 |
| | | | | Difference | 0.010 | −0.002 | 0.002 | 0.010 | 0.030 | 0.000 | 0.006 | 0.037 | |
| Comparative Example 4 | Strong plasma | Strong plasma | — | End portion | 1.065 | 1.014 | 1.019 | 1.100 | 1.055 | 1.004 | 1.015 | 1.075 | 0.025 |
| | | | | Central portion | 1.051 | 1.011 | 1.025 | 1.089 | 1.015 | 1.004 | 1.008 | 1.027 | 0.062 |
| | | | | Difference | 0.014 | 0.003 | −0.006 | 0.011 | 0.040 | 0.000 | 0.007 | 0.048 | |
| Comparative Example 5 | Weak plasma | Weak plasma | — | End portion | 1.025 | 1.014 | 1.013 | 1.053 | 1.025 | 1.004 | 1.015 | 1.045 | 0.008 |
| | | | | Central portion | 1.019 | 1.011 | 1.017 | 1.048 | 1.015 | 1.014 | 1.009 | 1.039 | 0.009 |
| | | | | Difference | 0.006 | 0.003 | −0.004 | 0.005 | 0.010 | −0.010 | 0.006 | 0.006 | |
| Comparative Example 6 | — | — | — | End portion | 1 | 1 | 1 | 1 | 0.999 | 1.000 | 1.002 | 1.001 | −0.001 |
| | | | | Central portion | 0.989 | 1.008 | 1.004 | 1.001 | 0.989 | 1.008 | 1.001 | 0.998 | 0.003 |
| | | | | Difference | 0.011 | −0.008 | −0.004 | −0.001 | 0.010 | −0.008 | 0.001 | 0.003 | |

Comparison among cells in the tenth batch in Examples and Comparative Examples shows that in Examples 1 to 4 and Comparative Examples 1 to 5 where the hydrogen plasma treatment was performed, higher Pmax was exhibited, and conversion characteristics were improved by the hydrogen plasma treatment as compared to Comparative Example 6 where the hydrogen plasma treatment was not performed. In particular, conversion efficiency was remarkably improved in Comparative Example 4 where the hydrogen plasma treatment was performed under the strong plasma treatment condition, and the second thin-film was not deposited, and in Examples 1 to 4 where the second thin-film was deposited at the high hydrogen dilution ratio after the hydrogen plasma treatment under the strong plasma treatment condition. In each of Examples and Comparative Examples, the difference in Pmax between the cell at the end portion and the cell at the central portion in the same batch was about 1% or less, and there was no significant variation in conversion efficiency within the same batch.

In Comparative Example 4, the cell in the tenth batch had high conversion efficiency, but the conversion characteristics of the cell in the 1000th batch were markedly deteriorated. In particular, the cell at the central portion has high ΔPmax, and there is a large variation in characteristics within one batch and among batches. In other words, although the characteristics of the cell in the initial batch of deposition can be improved by subjecting the intrinsic amorphous silicon thin-film to the hydrogen plasma treatment, the characteristics of the cell are deteriorated with an increase in the number of continuous deposition batches, and a characteristic variation within one batch is increased. In Comparative Examples 2 and 3 where the second thin-film was deposited at a low hydrogen dilution ratio after the hydrogen plasma treatment under the strong plasma treatment condition and in Comparative Example 1 where the second thin-film was deposited at a hydrogen dilution ratio of 30, there was a large characteristic variation within one batch and among batches as in the case of Comparative Example 4.

On the other hand, it is apparent that in Examples 1 to 4 where the second thin-film was deposited at a high hydrogen dilution ratio after the hydrogen plasma treatment, the cell in the 1000th batch retained high conversion characteristics, and the variation in characteristics within one batch was small.

Comparison of the thickness evaluation results in Table 2 with the results of evaluation of conversion characteristics in Table 4 shows that there is a high correlation between a variation in thickness of the intrinsic silicon thin-films in each of Experimental Examples and Comparative Experimental Examples (Table 2) and a variation in characteristics of the solar cell in each of Examples and Comparative Examples (Table 4). It is thus apparent that, in Examples 1 to 4, the second intrinsic silicon thin-film was deposited at a high hydrogen dilution ratio so as to compensate for the in-plane distribution of the plasma intensity, which is caused by an increase in the number of continuous deposition batches, and thus the distribution of the thickness of the intrinsic silicon thin-film within one batch and among batches is reduced. Accordingly, the effect of improving conversion characteristics by the hydrogen plasma treatment can be maintained even when the number of continuous deposition batches is increased.

Although the disclosure has been described with respect to only a limited number of embodiments, those skilled in the art, having benefit of this disclosure, will appreciate that various other embodiments may be devised without departing from the scope of the present invention. Accordingly the scope of the invention should be limited only by the attached claims.

What is claimed is:

1. A method for manufacturing a crystalline silicon-based solar cell, the method comprising, in the following order:
   forming a first intrinsic thin-film having a thickness of 3 to 15 nm on a conductive single-crystalline silicon substrate;
   performing a hydrogen plasma etching by exposing a surface of the first intrinsic thin-film to a hydrogen plasma;
   forming a second intrinsic thin-film having a thickness of 0.5 to 5 nm on the first intrinsic thin-film; and
   forming a conductive silicon-based thin-film in direct contact with the second intrinsic thin-film,
   wherein the hydrogen plasma etching and formation of the second intrinsic thin-film are performed in the same chemical vapor deposition (CVD) chamber, while a plurality of conductive single-crystalline silicon substrates are disposed in the CVD chamber, and the second intrinsic thin-film is formed by plasma-enhanced CVD with a silicon-containing gas and a hydrogen gas introduced into the CVD chamber,
   wherein an amount of the hydrogen gas introduced into the CVD chamber during the formation of the second intrinsic thin-film is 50 to 500 times an amount of the silicon-containing gas introduced into the CVD chamber,
   wherein a power density during the hydrogen plasma etching is 60 mW/cm$^2$ or more, and
   wherein a power density during the formation of the second intrinsic thin-film is 60 mW/cm$^2$ or more, and is 0.7 to 1.3 times the power density of the hydrogen plasma etching.

2. The method according to claim 1, wherein
   forming the first intrinsic thin-film is performed by plasma-enhanced CVD with a silicon-containing gas and a hydrogen gas introduced into a CVD chamber, and
   an amount of the hydrogen gas introduced into the CVD chamber during the formation of the first intrinsic thin-film is less than 50 times an amount of the silicon-containing gas introduced into the CVD chamber.

3. The method according to claim 1, wherein
   a deposition rate during the formation of the first intrinsic thin-film is 0.1 nm/sec or more, wherein the deposition rate is calculated as a deposition rate on a smooth surface.

4. The method according to claim 1, wherein
   a difference $d_0-d_1$ is 0.5 to 5 nm, wherein do is the thickness of the first intrinsic thin-film before the hydrogen plasma etching and $d_1$ is a thickness of the first intrinsic thin-film after the hydrogen plasma etching, and
   the thickness of the second intrinsic thin-film is 0.5 to 2 times the difference $d_0-d_1$.

5. The method according to claim 1, wherein
   each of a power density during the hydrogen plasma etching and a power density during formation of the second intrinsic thin-film is not less than 2 times a power density during formation of the first intrinsic thin-film.

6. The method according to claim 1, wherein
   the formation of the first intrinsic thin-film, the hydrogen plasma etching and the formation of the second intrinsic thin-film are performed in the same CVD chamber.

7. The method according to claim 1, wherein
   the formation of the conductive silicon-based thin-film, the hydrogen plasma etching and the formation of the second intrinsic thin-film are performed in the same CVD chamber.

8. The method according to claim 1, wherein
   forming the first intrinsic thin-film is performed by stacking, in the following order, first to nth sublayers on the conductive single-crystalline silicon substrate,
   n is an integer of 2 or more, and
   the hydrogen plasma etching is performed after formation of the nth sublayer.

9. The method according to claim 8, wherein
   one of the first to $(n-1)^{th}$ sublayers is subjected to an intermediate hydrogen plasma treatment in which a surface of the sublayer is exposed to a hydrogen plasma after formation of the sublayer.

10. The method according to claim 8, wherein
    forming the first intrinsic thin-film is performed by stacking, in the following order, a first sublayer and a second sublayer on the conductive single-crystalline silicon substrate,
    the first sublayer is subjected to an intermediate hydrogen plasma treatment in which a surface of the first sublayer is exposed to a hydrogen plasma after formation of the first sublayer, and
    the hydrogen plasma etching is performed after formation of the second sublayer.

11. The method according to claim 9, wherein
    a total plasma etching amount is 0.5 to 5 nm, wherein the total plasma etching amount is a sum of a plasma etching amount in the intermediate hydrogen plasma treatment performed after formation of each of the first to (n−1)th sublayers and a plasma etching amount in the hydrogen plasma etching performed after formation of the nth sublayer, and
    the thickness of the second intrinsic thin-film is 0.5 to 2 times the total plasma etching amount.

12. The method according to claim 8, wherein each of the sublayers has a thickness of 1 to 8 nm.

13. The method according to claim 8, wherein the first sublayer has a thickness of 1 to 6 nm.

* * * * *